(12) United States Patent
Yeh et al.

(10) Patent No.: US 7,035,147 B2
(45) Date of Patent: Apr. 25, 2006

(54) OVERERASE PROTECTION OF MEMORY CELLS FOR NONVOLATILE MEMORY

(75) Inventors: Chih Chieh Yeh, Taipei (TW); Wen Jer Tsai, Hualien (TW); Tao Cheng Lu, Kaohsiung (TW)

(73) Assignee: Macronix International Co., Ltd., (CN)

( * ) Notice: Subject to any disclaimer, the term of this patent is extended or adjusted under 35 U.S.C. 154(b) by 202 days.

(21) Appl. No.: 10/465,396

(22) Filed: Jun. 17, 2003

(65) Prior Publication Data

US 2004/0257880 A1 Dec. 23, 2004

(51) Int. Cl.
*G11C 16/04* (2006.01)

(52) U.S. Cl. .............................. 365/185.29; 365/185.3; 365/185.26; 365/185.22

(58) Field of Classification Search ........... 365/185.29, 365/185.3, 185.26, 185.22
See application file for complete search history.

(56) References Cited

U.S. PATENT DOCUMENTS

| | | | | |
|---|---|---|---|---|
| 5,650,964 A * | 7/1997 | Chen et al. | ............ | 365/185.25 |
| 5,768,192 A | 6/1998 | Eitan | | |
| 5,978,274 A * | 11/1999 | Wang | .................... | 365/185.29 |
| 6,055,183 A * | 4/2000 | Ho et al. | ............... | 365/185.09 |
| 6,614,692 B1 * | 9/2003 | Eliyahu et al. | ........ | 365/185.29 |
| 6,614,693 B1 * | 9/2003 | Lee et al. | ............... | 365/185.29 |
| 6,721,204 B1 * | 4/2004 | Yeh et al. | ............... | 365/185.24 |
| 6,724,661 B1 * | 4/2004 | Lee et al. | .............. | 365/185.29 |
| 6,744,675 B1 * | 6/2004 | Zheng et al. | .......... | 365/185.28 |

FOREIGN PATENT DOCUMENTS

WO  WO 00/58969  10/2000

* cited by examiner

*Primary Examiner*—Connie C. Yoha
(74) *Attorney, Agent, or Firm*—Baker & McKenzie

(57) ABSTRACT

The invention provides a nonvolatile memory and corresponding method having an optimal memory erase function and, more particularly, a method for erasing a nonvolatile memory comprising a source, a gate, a drain, a channel and a trapping layer. The method according to a preferred embodiment of the invention generally comprises the steps of applying a non-zero gate voltage to the gate, applying a non-zero source voltage to the source, applying a non-zero drain voltage to the drain in each erase shot wherein the drain voltage is generally higher in magnitude than the source voltage, generating hot holes in the nonvolatile memory, injecting the generated hot holes in the trapping layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

13 Claims, 8 Drawing Sheets

Short channel cell:
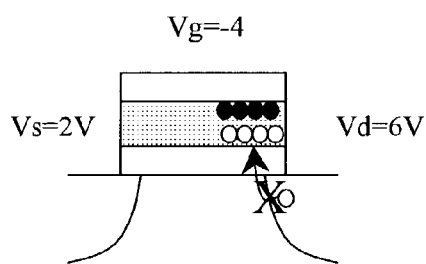 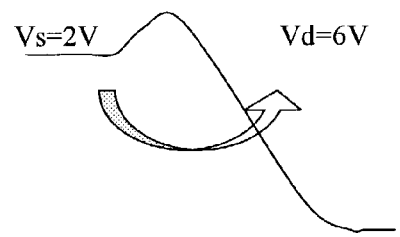
FIG. 4A  FIG. 4B
Long channel cell:
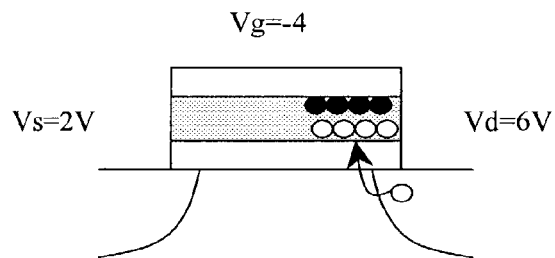 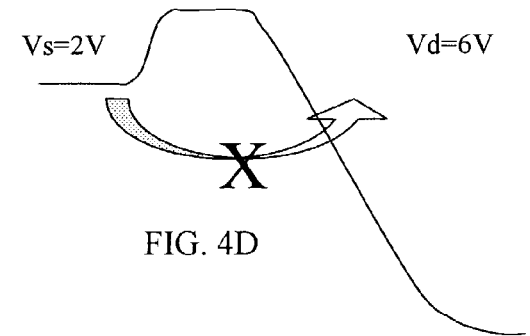
FIG. 4C  FIG. 4D

OVERERASE PROTECTION OF MEMORY CELLS FOR NONVOLATILE MEMORY

BACKGROUND OF THE INVENTION

1. Field of the Invention

The invention generally relates to semiconductor memory devices and, more particularly, to a method and system for overerase protection of memory cells for nonvolatile memory.

2. Description of the Related Art

Memory devices for nonvolatile storage of information are commonly available in the art. Exemplary nonvolatile semiconductor memory devices include read only memory (ROM), flash memory, programmable read only memory (PROM), erasable programmable read only memory (EPROM), electrically erasable programmable read only memory (EEPROM) and flash EEPROM.

Flash EEPROMs are similar to EEPROMs in that memory cells can be programmed (i.e., written) and electrically erased. Flash EEPROMs further include the additional capability of erasing all memory cells therein at once. The common use of EEPROM semiconductor memory has prompted the development of an EEPROM memory cell with optimal performance characteristics, e.g., shorter programming times, lower voltage usage for programming and reading, longer data retention time, shorter erase time, smaller and miniaturized physical dimensions.

Non-volatile memory devices have been developed by the semiconductor integrated circuit industry for various applications such as computers and digital communications. A variety of non-volatile memory devices with oxide-nitride-oxide (ONO) structures have been developed. An example of a typical non-volatile memory with an ONO structure includes a semiconductor substrate with source and drain regions, and a oxide-nitride-oxide film on top of the substrate surface between the source and the drain. The nitride layer of the ONO film is capable of trapping electrons which are generated in the channel region of the semiconductor substrate during a programming operation.

In programming the memory cell, the respective nitride layer is charged with electrons, causing the turn-on threshold of the memory cell to accordingly increase. As the memory cell is being programmed, it will not turn on and remains nonconductive when being addressed with a read potential applied to its control gate. In erasing the memory cell, holes are injected into the nitride layer to recombine or compensate the stored electrons to accordingly lower the threshold. With the lower threshold, the memory cell accordingly turns on and changes into a conductive state when being addressed with a read potential to the control gate.

For a localized trapping storage nonvolatile memory, the memory programming is performed by hot electron injection at the channel, whereas memory erase is performed by band-to-band hot hole injection. FIG. 1 is a schematic view that illustrates an exemplary erase operation for a flash memory cell according to a method in the art using hot hole injection. In each erase shot, a positive voltage is applied to the drain 101, the gate 102 is negatively biased, the source 100 is floated and the substrate is grounded. According to this particular example of an erase operation in the art, the voltage of the gate is −4 volts (V) in each erase shot where the drain voltage is 6V for each shot. As a positive voltage is applied to the drain 101, an electric field is formed along a path from the drain 101 to the gate 102. The holes flowing out of the drain 101 are accordingly directed to the gate 102 and are then trapped in the trapping layer in completing the erase operation. An erase verify step is performed after each erase shot to verify the completeness of the erase operation.

FIG. 2 is a schematic view that further illustrates another exemplary memory erase operation in the art using band-to-band hot hole injection. In contrast to the exemplary memory erase operation described in conjunction with FIG. 1, the positive voltage applied in the drain 101 is raised as the erase shot increases, as the gate 102 is biased, the source 100 is floated and the substrate 106 is grounded for each erase shot. The holes at the drain 101 include raising voltage potentials. Using a raising voltages can increase amount of hot holes pumped into the trapping layer and increase erase strength as the shot number increases and the erase time can be largely reduced. The speed of the memory erase operation is affected by the length of the channel. The erase speed of a relatively short channel is much higher than that of a long channel, which results in the overerase of the short channel cell. FIG. 3 is a graphical schematic view illustrating an exemplary relationship between the voltage threshold and the program state for the memory erase operation shown in FIG. 2. A large erase speed variation is obtained according to this erase operation algorithm, which will result in overerase in fast erase cells.

For programming a memory array of memory cells according to a method in the art, the respective nitride layer of the addressed cells is injected with electrons, causing a negative charge to accordingly accumulate in the floating gates and the turn-on threshold of the memory cell to increase. As similarly described herein and above, the addressed cells will not turn on as they are being programmed and will accordingly remain nonconductive when addressed with read potentials applied to the respective control gates. In erasing a memory cell having a negatively charged nitride layer, holes are injected into the nitride layer to recombine or compensate the stored electrons to accordingly lower the threshold. With the lower threshold, the memory cell turns on and accordingly changes to a conductive state when addressed with a read potential to the control gate.

As the memory erase requires the lowering of the threshold by accordingly injecting the hot holes to recombine or compensate the stored electrons in the respective nitride layer, memory cells adversely encounter risks of overerase. Overerase occurs if too many holes are injected into the respective nitride layer, which leaves a slightly positive charge therein. This positive charge biases the memory cell and slightly turns it on. As a result, small amounts of current may leak through the memory cell even though it is not addressed at the time of the current leak. A number of overerased memory cells along a given data line can adversely cause an accumulation of leakage current leading to a false reading of data.

In addition to causing false data reading, it is difficult to successfully reprogram overerased memory cells using hot electron programming, particularly if there are embedded algorithms in the integrated circuits. This difficulty arises since the amount of electrons needed to move an overerased memory cell to a programmed state is generally higher than that of memory cells unencumbered by memory overerase. Furthermore, because the memory erase and programming operations impact a plurality of memory cells in a memory array with varying degrees, it is difficult to verify the success of the memory erase and programming operations for the memory array as a whole. In any event, the repair and repair verification processes are often resource-intensive and time-consuming.

Therefore, there is a general need in the art for a nonvolatile memory and corresponding method having an optimal memory erase function and, more particularly, a nonvolatile memory and corresponding method advantageously overcoming at least the aforementioned shortcomings in the art. Moreover, a method and device are needed in the art that optimally correct and repair overerased nonvolatile memory (such as flash, floating gate and ONO film storage nonvolatile memory) in an expeditious and efficient manner.

SUMMARY OF THE INVENTION

The invention provides a nonvolatile memory and corresponding method having an optimal memory erase function and, more particularly, a nonvolatile memory and corresponding method that optimally correct and repair overerased nonvolatile memory (such as flash and floating gate nonvolatile memory) in an expeditious and efficient manner. Various embodiments of the invention are applicable to a plurality of nonvolatile memory devices, including read only memory (ROM), flash memory, programmable read only memory (PROM), erasable programmable read only memory (EPROM), electrically erasable programmable read only memory (EEPROM), flash EEPROM, and, more particularly, silicon-oxide-nitride-oxide-silicon (SONOS) nonvolatile memory and floating gate nonvolatile memory.

A preferred embodiment according to the invention advantageously provides a method for erasing a nonvolatile memory comprising a source, a gate, a drain, a channel and a charge storage layer. The method according to this particular embodiment of the invention generally comprises the steps of applying a non-zero gate voltage to the gate in each erase shot, applying a non-zero source voltage to the source in each erase shot, applying a non-zero drain voltage to the drain wherein the drain voltage is generally higher in magnitude than the source voltage in each erase shot, generating hot holes in the nonvolatile memory, injecting the generated hot holes in the charge storage layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

Another embodiment according to the invention advantageously provides a method for erasing a nonvolatile memory comprising a source, a gate, a drain, a channel and a charge storage layer. The method according to this embodiment of the invention comprises the steps of applying a negative, generally constant gate voltage to the gate in each erase shot, applying a positive source voltage to the source wherein the source voltage increases as the erase shot number increases in each erase shot, applying a positive drain voltage to the drain wherein the drain voltage is generally higher than the source voltage and the drain voltage increases as the erase shot number increases in each erase shot, generating hot holes in the nonvolatile memory, injecting the generated hot holes in the charge storage layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

Yet another embodiment according to the invention advantageously provides a method for erasing a nonvolatile memory comprising a source, a gate, a drain, a channel and a charge storage layer. The method according to this embodiment of the invention comprises the steps of applying a gate voltage to the gate wherein the gate voltage decreases as the erase shot number increases, applying a positive, generally constant source voltage to the source in each erase shot, applying a positive, generally constant drain voltage to the drain wherein the drain voltage is generally higher than the source voltage in each erase shot, generating hot holes in the nonvolatile memory, injecting the generated hot holes in the charge storage layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

A yet additional embodiment according to the invention advantageously provides a method for erasing a nonvolatile memory comprising a source, a gate, a drain, a channel and a charge storage layer. The method according to this embodiment of the invention comprises the steps of applying a negative, generally constant gate voltage to the gate, applying a positive, generally constant source voltage to the source, applying a positive, generally constant drain voltage to the drain wherein the drain voltage is generally higher than the source voltage, generating hot holes in the nonvolatile memory, injecting the generated hot holes in the charge storage layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

BRIEF DESCRIPTION OF THE DRAWINGS

The preferred and other embodiments of the invention are further described in the following detailed description herein and below in conjunction with the accompanying drawings (not necessarily drawn to scale), in which:

FIGS. 4A, 4B, 4C and 4D are schematic views respectively illustrating the coupling effects of a long channel cell and a short channel cell in an exemplary memory erase operation according to the invention using band-to-band hot hole injection.

DETAILED DESCRIPTION OF PREFERRED EMBODIMENTS

Figure 1:
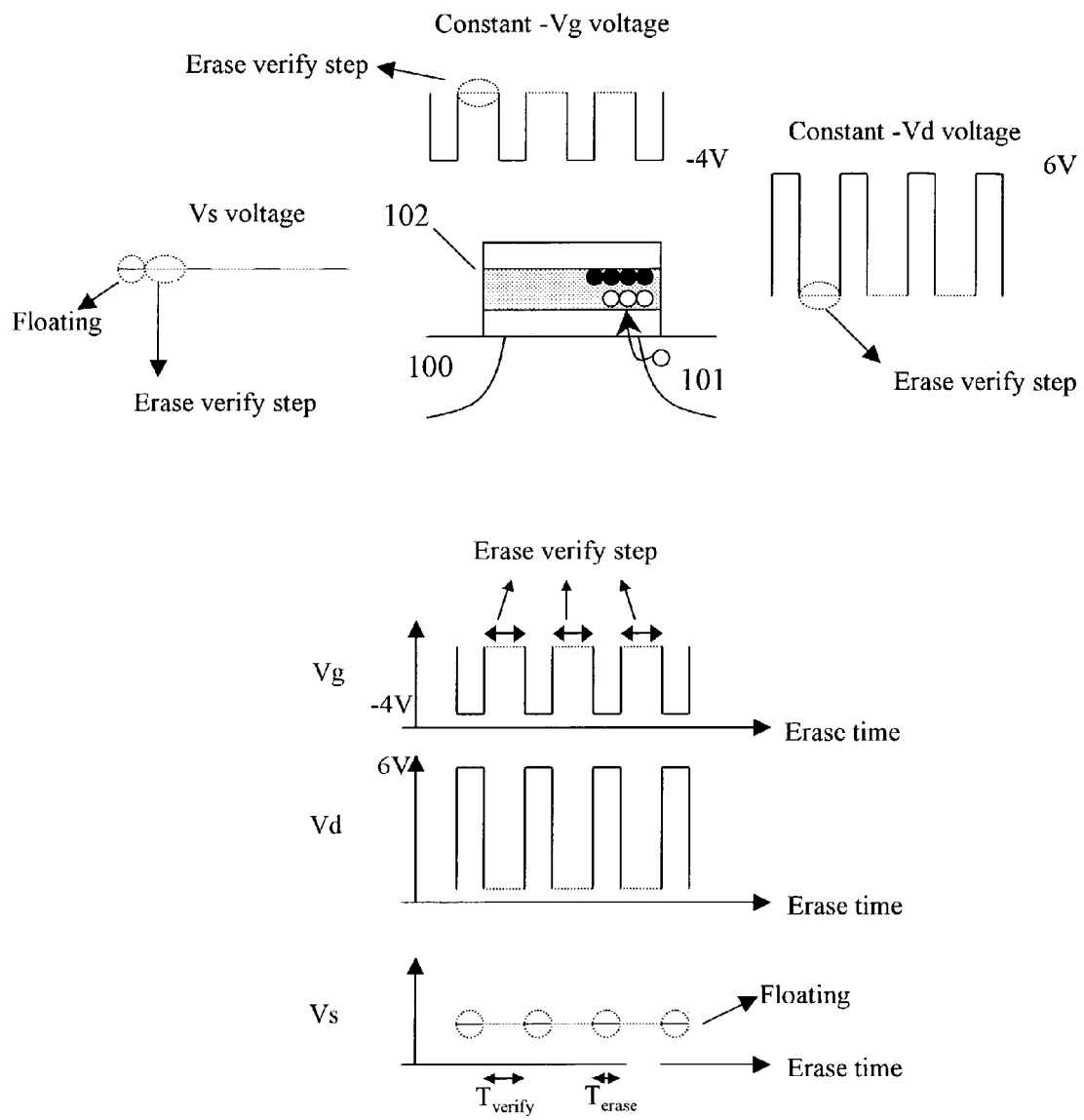
FIG. 1 is a schematic view illustrating an exemplary erase operation for a flash memory cell according to a method in the art using hot hole injection.
Figure 2:
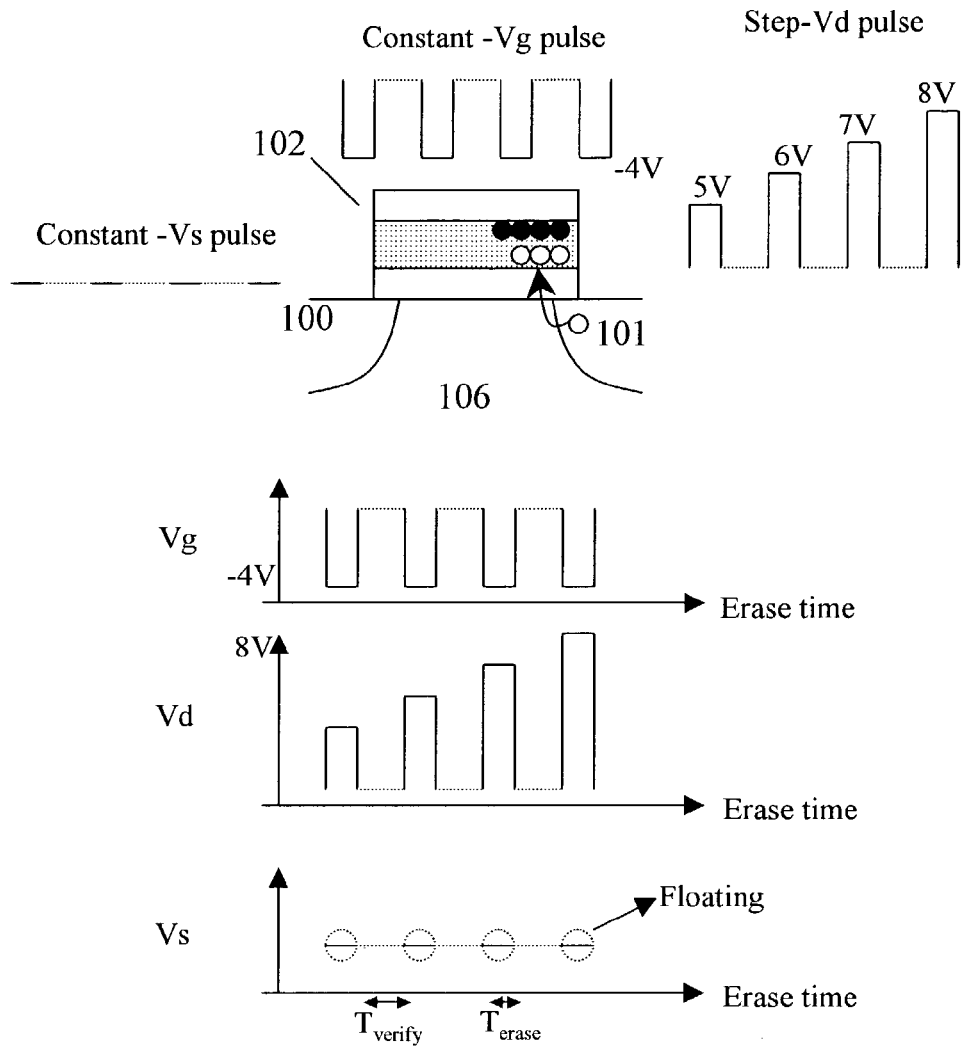
FIG. 2 is a schematic view further illustrating another exemplary memory erase operation in the art using band-to-band hot hole injection.

The details of the invention will be described hereinafter in conjunction with the appended drawings. Those ordinarily skilled in the art should understand that the following includes exemplary descriptions of the invention. Modifications and variations within the scopes and spirits of the invention are accordingly covered by the scope of the invention, which is defined by the appended claims and their equivalents.

A preferred embodiment according to the invention advantageously provides a method for erasing a nonvolatile memory comprising a source, a gate, a drain, a channel and a trapping layer. The method according to this particular embodiment of the invention generally comprises the steps of (a) applying a non-zero gate voltage to the gate, (b) applying a non-zero source voltage to the source, (c) applying a non-zero drain voltage to the drain wherein the drain voltage is generally higher in magnitude than the source voltage, (d) generating hot holes in the nonvolatile memory, (e) injecting the generated hot holes in the trapping layer, and (f) accordingly erasing the nonvolatile memory. The erase method according to a further embodiment of the invention comprises a verifying step for verifying the memory erase for the nonvolatile memory, i.e., step (f), and repeating steps (a), (b), (c), (d) and (e) if the memory erase is not verified.

Various embodiments of the invention are applicable to a plurality of nonvolatile memory devices, including read only memory (ROM), flash memory, programmable read only memory (PROM), erasable programmable read only memory (EPROM), electrically erasable programmable read only memory (EEPROM), flash EEPROM, and, more particularly, silicon-oxide-nitride-oxide-silicon (SONOS) nonvolatile memory and floating gate nonvolatile memory.

FIGS. 4A, 4B, 4C and 4D are schematic views respectively illustrating the coupling effects of a short channel cell and a long channel cell in an exemplary memory erase operation according to the invention using band-to-band hot hole injection. A negative, generally constant gate voltage (e.g., −4 V) is applied to the gate of the nonvolatile memory, whereas a positive, generally constant drain voltage (e.g., 6 V) is applied to the drain. A modified source voltage, also positive and generally constant (e.g., 2 V), is applied to the source. Physical dimension variation of the memory cell would result in erase speed variation (i.e., in relative degree, a fast bit, normal bit, or slow bit), depending on the changes in the process steps of the memory erase operation. As memory cells with relatively fast erase speed (i.e., short channel cells), as illustrated in FIG. 4A, are erased to a low threshold level, the source bias will be coupled to the drain and accordingly reduces the lateral electric field as shown in the FIG. 4B. The erase speed of the fast bit is then slowed down. For other long channel bits that have slower erase speeds (per FIG. 4C), the source bias will not couple to the drain side (FIG. 4D). As a result, the speeds of the long channel and short channel bits are similar in magnitude. Relatively smaller voltage threshold Vt distribution can be obtained after verifying the memory erase because of adverse overerase effects induced by the source bias.

Another preferred embodiment according to the invention advantageously provides a method for erasing a nonvolatile memory comprising a source, a gate, a drain, a channel and a trapping layer. The method according to this embodiment of the invention comprises the steps of applying a negative, generally constant gate voltage to the gate, applying a positive source voltage to the source wherein the source voltage raises as the erase shot number increases, applying a positive drain voltage to the drain wherein the drain voltage is generally higher than the source voltage and the drain voltage raises as the erase shot number increases, generating hot holes in the nonvolatile memory, injecting the generated hot holes in the trapping layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

Figure 5A:
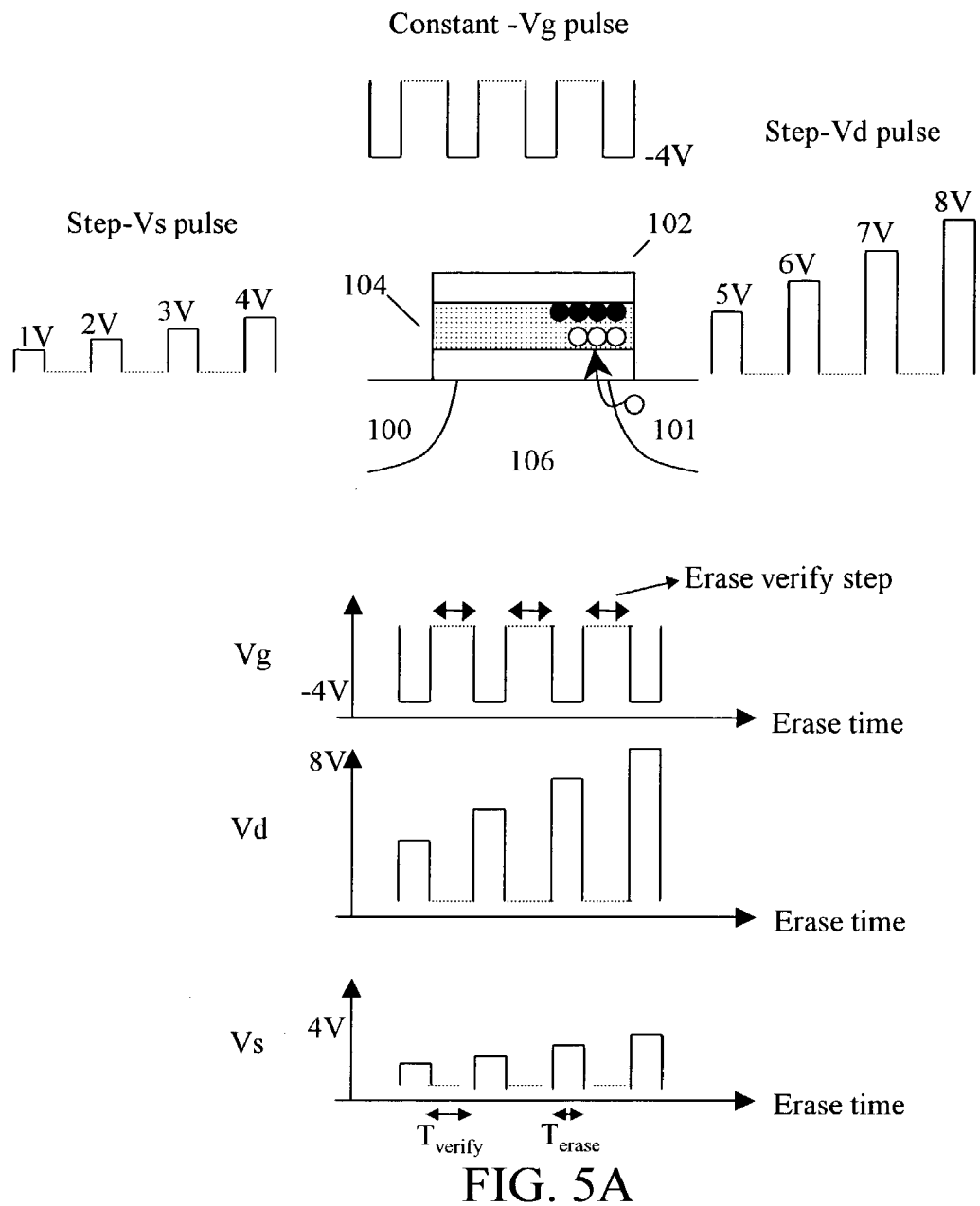
FIG. 5A is a schematic view illustrating an exemplary memory erase operation according to the invention using hot hole injection.
Figure 5B:
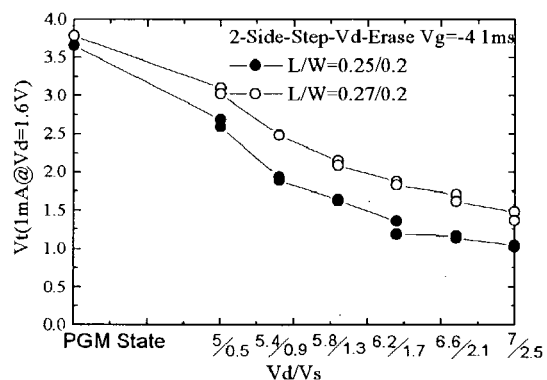
FIG. 5B is a graphical schematic view illustrating an exemplary relationship between voltage threshold and the programming state for the nonvolatile memory as shown in FIG. 5A.

FIG. 5A is a schematic view that illustrates an exemplary memory erase operation according to this particular embodiment of the invention using hot hole injection as described herein and immediately above. FIG. 5B is a graphical schematic view that illustrates an exemplary relationship between voltage threshold and the programming state for the nonvolatile memory as shown in FIG. 5A. The nonvolatile memory cell is erased by hot hole injection, where the gate 102 is negatively biased, and the substrate is grounded. First positive voltage pulse Vd which increases as the erase shot number increases is applied to the drain 101 and a second positive voltage pulse Vs which increases as the erase shot number increases is applied to the source 100. According to this particular embodiment of the invention, the voltage of the gate is −4 V, where the first voltage is increased from 5V to 8V as the erase shot increases. The second voltage pulse Vs is increased from 1V to 4V as the erase shot number increases, which correspondingly has a difference of 4 V to the first voltage. As a positive voltage is applied to the drain 101, an electric field is formed along a path from the drain 101 to the gate 102, the hot holes flowing out of the drain 101 are directed to the gate 102 and are then trapped in the trapping layer near drain junction for completing the memory erase operation. The second voltages are applied to the source 100. As the memory cell with relatively fast erase speed (i.e., the short channel cell) is erased at low threshold level, the source bias will couple to the drain and accordingly reduces the lateral electric field. The erase speed of the relatively fast bit is slowed down and the speeds of other bits (such as the long channel cell) are generally the same. Relatively smaller Vt distribution can be obtained after verifying the memory erase because of adverse overerase effects induced by the source bias. As a result, the memory cells of the short and long channels have substantially similar memory erase time and overerase problems can thus be avoided.

Figure 6:
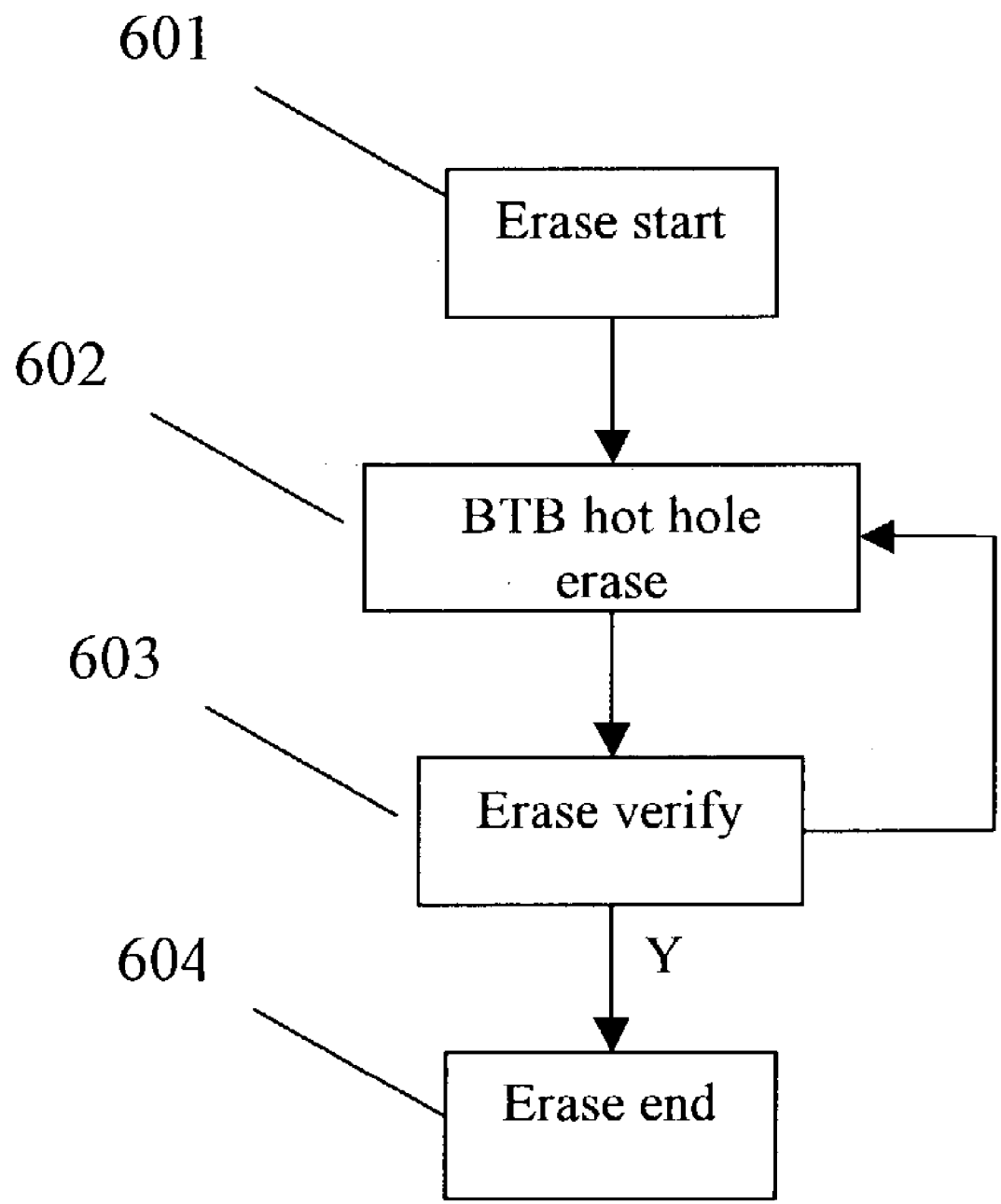
FIG. 6 is a flow diagram generally illustrating the process steps of an exemplary memory erase operation according to the invention.

FIG. 6 is a flow diagram that generally illustrates an exemplary erase operation for a nonvolatile memory according to the invention. The memory erase operation starts at step 601. In step 602, a band-to-band (BTB) hot hole injection is performed for erasing the trapping layer in the nonvolatile memory. The drain 101 and the source 100 are applied with a first and a second voltages according to the invention (as described herein and above) for performing the memory erase operation. In step 603, a verification step is performed for verifying the state of the trapping layer. If the memory erase is not verified in step 603, the control flow returns back to step 602 of hole injection for applying another two voltages to the source and drain for performing another memory erase operation in the nonvolatile memory. If the memory erase is verified in step 603, the control flow is complete in step 604 and the process according to the invention ends.

Figure 3:
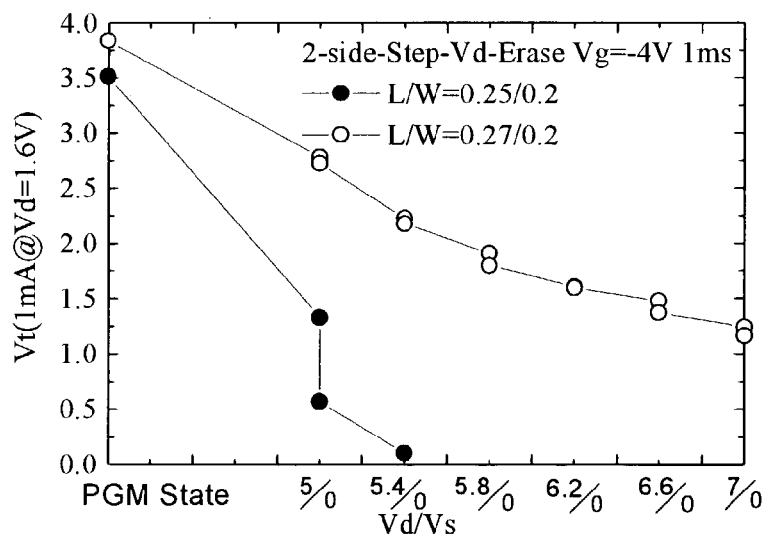
FIG. 3 is a graphical schematic view illustrating an exemplary relationship between the voltage threshold and the program state for the memory erase operation shown in FIG. 2.

FIGS. 3 and 5B are graphical schematic views respectively illustrating exemplary relationships between the voltage threshold and the programming state of a nonvolatile memory under memory erase operations in the art and in accordance with the invention. The voltage threshold is measured between the gate 102 and the substrate 106, which is strongly affected by the voltage in the trapping layer. If the trapping layer includes a relatively large number of holes, the voltage threshold accordingly decreases. In the memory erase operations illustrated in accordance with FIGS. 3 and 5B, the drain side is erased, and a voltage of −4V is applied to the gate where the time width for each erase shot is 1 millisecond (ms). In a first scenario as indicated by black dots, the ratio of channel length to the channel width is approximately 0.25/0.2. In a second scenario as indicated by the white dots, the ratio of channel length to the channel width is approximately 0.27/0.2. The first scenario involves a short channel memory cell, whereas the second scenario involves a long channel cell. For the memory erase operation in the art, it is shown in FIG. 3 that the short channel bits (black dots) are erased with relatively quick speed, while the long channel bits (white dots) are erased with a relatively slower speed. If it is desired to completely erase the long channel bits, the short channel bits is likely to be overerased as a result. For the memory erase operation according to the invention, it is shown in FIG. 5B that the line connected by the black dots descends slowly, which apparently indicates a relatively longer erase time. Consequently, the memory erase time of the short channel bit is prolonged, and overerase problems are advantageously avoided.

A yet additional embodiment according to the invention advantageously provides a method for erasing a nonvolatile memory comprising a source, a gate, a drain, a channel and a trapping layer. The method according to this embodiment of the invention comprises the steps of applying a negative, generally constant gate voltage to the gate in each erase shot, applying a positive, generally constant source voltage to the source in each erase shot, applying a positive, generally constant drain voltage to the drain in each erase shot wherein the drain voltage is generally higher than the source voltage, generating hot holes in the nonvolatile memory, injecting the generated hot holes in the trapping layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

Figure 7:
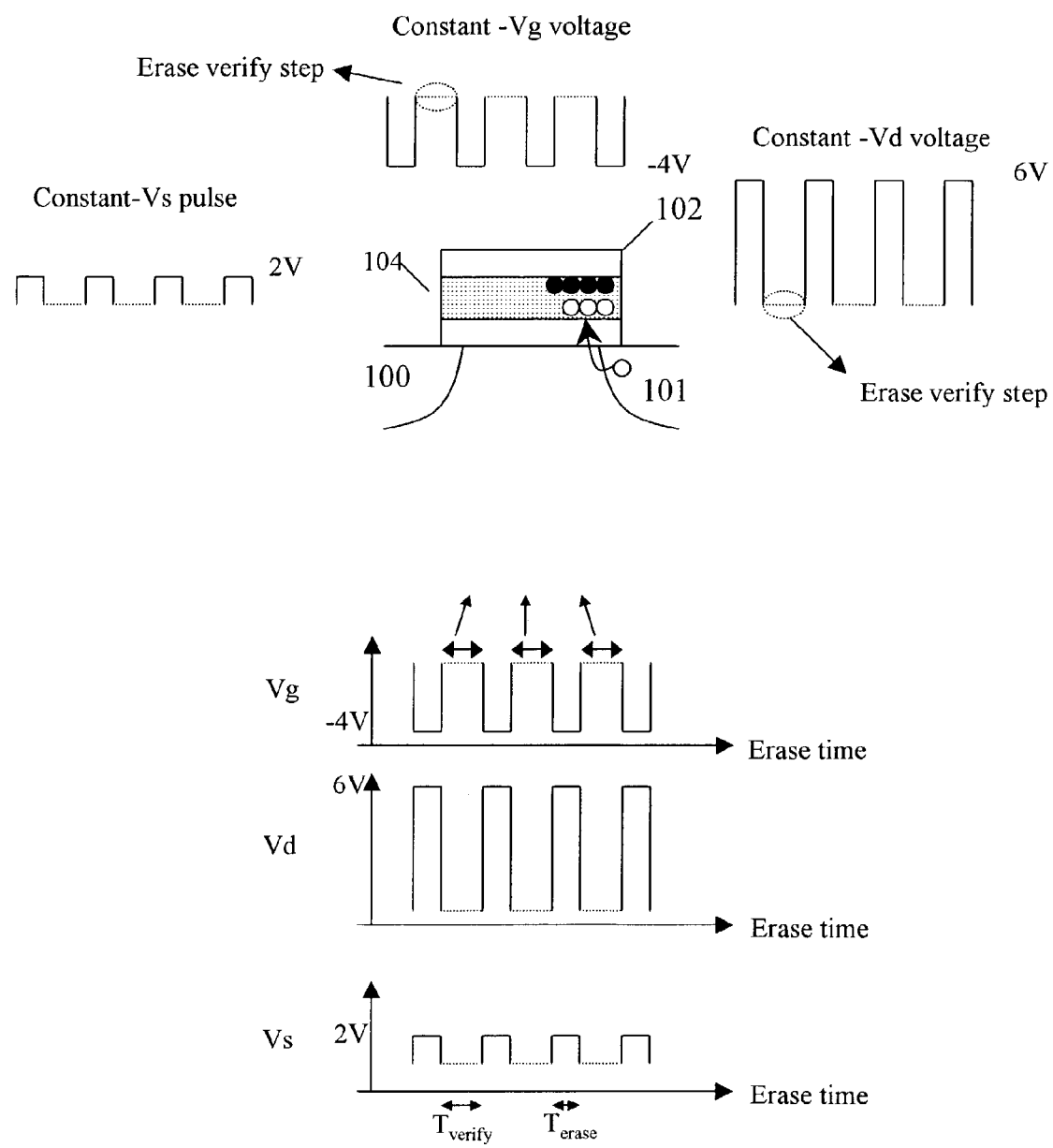
FIG. 7 is a schematic view further illustrating another embodiment of the memory erase method according to the invention.

FIG. 7 is a schematic view that further illustrates an exemplary memory erase operation according to this particular embodiment of the invention as described herein and immediately above. Referring to FIG. 7, generally constant voltages are applied to the gate, drain and source. The exemplary embodiment shown in FIG. 7 is similar to that shown in FIG. 5A, except that the voltages applied to the drain and source are generally constant, and the source is applied with a modified voltage that causes the source 100 to be coupled to the drain 101 as the channel length is relatively short.

Yet another embodiment according to the invention advantageously provides a method for erasing a nonvolatile memory comprising a source, a gate, drain, a channel and a trapping layer. The method according to this embodiment of the invention comprises the steps of applying a gate voltage to the gate wherein the gate voltage is a negative voltage and decreases as the erase shot increases, applying a positive, generally constant source voltage to the source in each erase shot, applying a positive, generally constant drain voltage to the drain in each erase shot wherein the drain voltage is generally higher than the source voltage, generating hot holes in the nonvolatile memory, injecting the generated hot holes in the trapping layer near drain junction, and accordingly erasing the nonvolatile memory. The erase method according to a further embodiment of the invention comprises a verifying step after each erase shot for verifying the memory erase for the nonvolatile memory, and repeating the process steps according to the invention if the memory erase is not verified.

Figure 8:
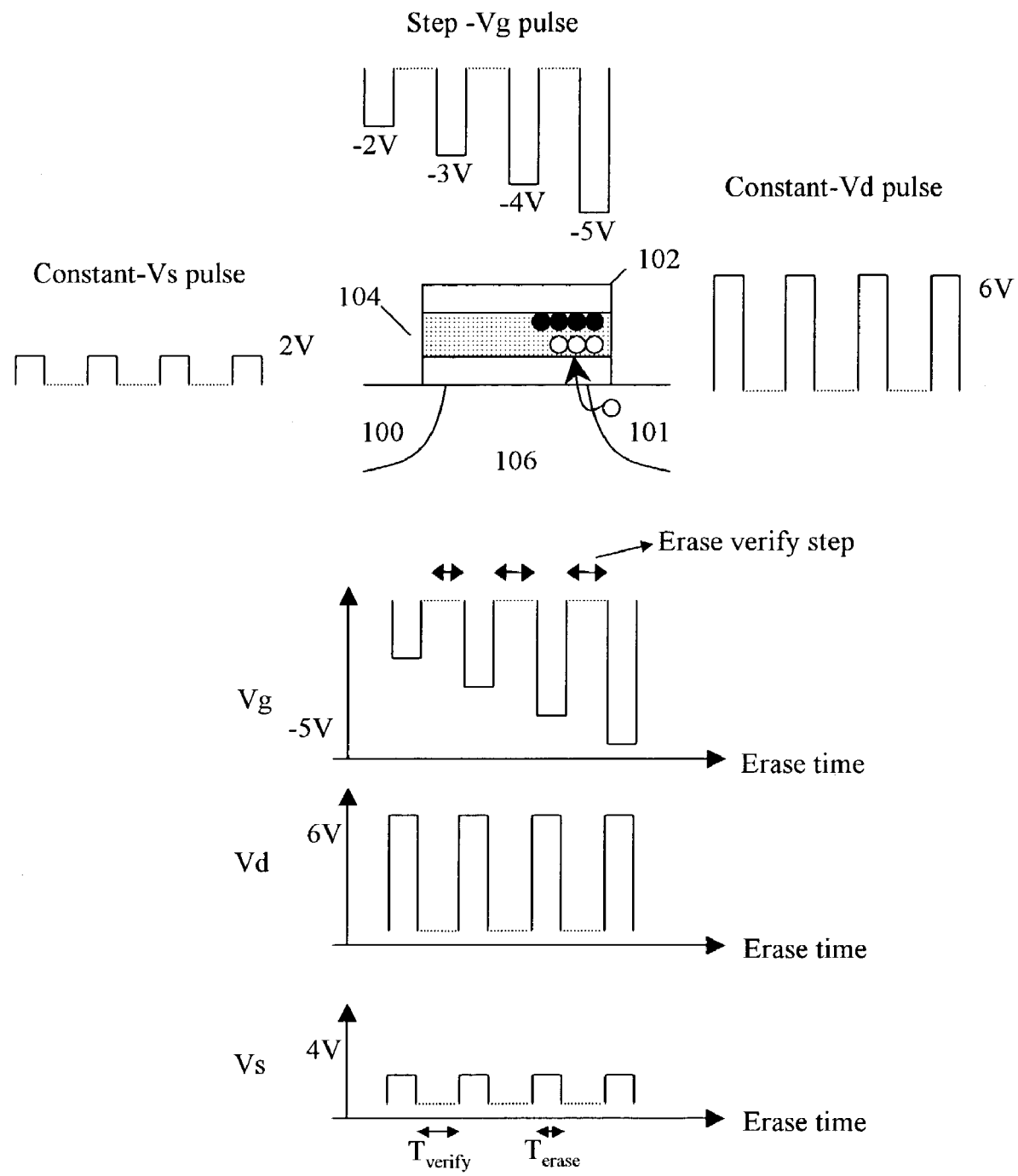
FIG. 8 is a schematic view further illustrating yet another embodiment of the memory erase method according to the invention.

FIG. 8 is a schematic view that further illustrates an exemplary memory erase operation according to this particular embodiment of the invention as described herein and immediately above. Referring to FIG. 8, a negative voltage which decreases as the erase shot increases is applied to the gate, and a modified source voltage is applied to the source. The exemplary embodiment illustrated in FIG. 8 is similar to that illustrated in FIG. 7, except that a negative voltage which decreases as the erase shot increases is applied to the gate 102. The voltage applied to the source 100 is selected so that for a short channel cell, the source 100 will be coupled to the drain 101 as the voltage threshold achieves a predetermined low level. Well-defined voltages being applied to the source 100, drain 101 and gate 102 will result in the memory cells having substantially similar memory erase speed so that overerase problems are advantageously avoided.

A further embodiment of the invention provides a nonvolatile memory having memory erase function comprising a substrate, a source having a non-zero source voltage applied thereto in each erase shot, a drain having a non-zero drain voltage applied thereto in each erase shot wherein the drain voltage is generally higher than the source voltage, a channel formed between the source and the drain, a first isolating layer over the channel, a trapping layer over the first isolating layer wherein hot holes are generated and injected in the trapping layer, a second isolating layer over the first isolating layer, a gate formed over and isolated by the second isolating layer wherein a gate voltage is applied to the gate. The nonvolatile memory according to this embodiment of the invention is erased in response to the injected hot holes, the applied gate voltage, the applied source voltage and the applied drain voltage.

Another embodiment of the invention provides a nonvolatile memory having memory erase function comprising a substrate, a source having a non-zero source voltage applied thereto in each erase shot, a drain having a non-zero drain voltage applied thereto in each erase shot wherein the drain voltage is generally higher than the source voltage, a channel formed between the source and the drain, a trapping layer over the channel wherein hot holes are generated and injected in the trapping layer, a gate enclosing the trapping layer wherein a gate voltage is applied to the gate. The nonvolatile memory according to this embodiment of the invention is erased in response to the injected hot holes, the applied gate voltage, the applied source voltage and the applied drain voltage.

The aforementioned embodiments are herein described based on erasing the drain bit in the nonvolatile memory, while generally the same process steps according to the invention can be used in erasing the source bit. The methods used are generally identical to those described herein and above. All the embodiments described herein and above can equally be applied in erasing the source bit so as to similarly and advantageously avoid overerase problems for memory erase operations in the nonvolatile memory. Moreover, although the above embodiments are generally applied to SONOS nonvolatile memory, those skilled in the art will appreciate that the invention can similarly be applied to floating gate nonvolatile memory and achieve substantially the same effect as described herein and above.

Figure 9:
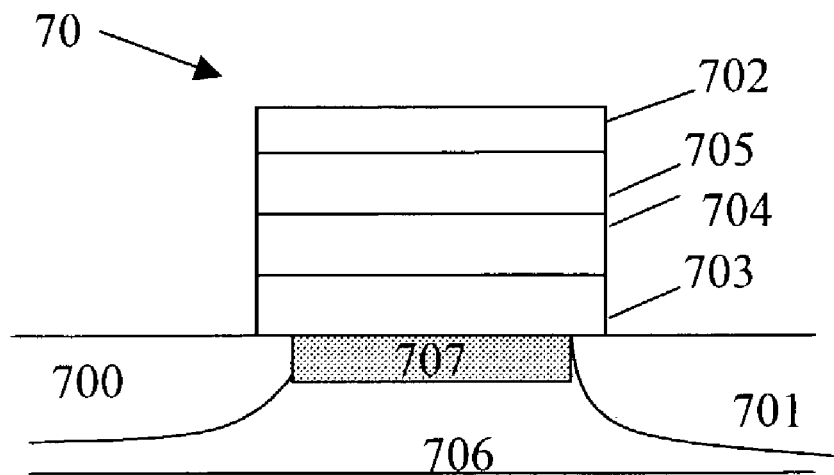
FIG. 9 is schematic view generally illustrating an exemplary silicon-oxide-nitride-oxide-silicon (SONOS) nonvolatile memory using the memory erase functionality according to the invention.
Figure 10:
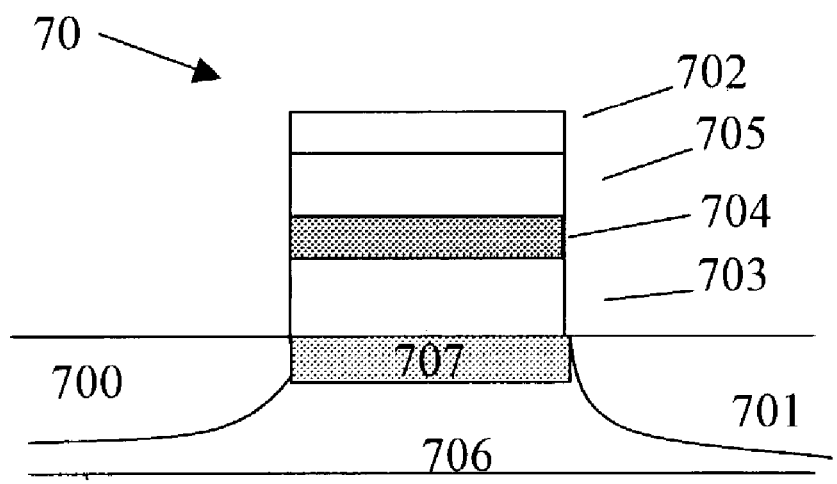
FIG. 10 is schematic view generally illustrating a floating gate nonvolatile memory using the memory erase functionality according to the invention.

FIGS. 9 and 10 are schematic view respectively illustrating a SONOS nonvolatile memory and floating gate nonvolatile memory using the memory erase functionality according to the invention. FIG. 9 is a structure diagram that illustrates the structure of a silicon-oxide-nitride-oxide-silicon (SONOS) nonvolatile memory cell where a nonvolatile memory cell 70 includes an N-channel MOSFET structure. The nonvolatile memory cell 70 includes a P type substrate 706 with two buried N+ junctions, one being the source 700 and the other being the drain 701. A channel 707 is formed between the source 700 and the drain 701. Above the channel is a first isolating layer 703, which generally is a silicon oxide layer. On top of the first isolating layer 703 is a trapping layer 704, which is a nitride layer. The trapping layer 704 forms the memory retention layer that traps the electrons as they are injected into the nitride layer. A second isolating layer 705, which is an oxide layer, is formed to overlay the silicon nitride layer. The silicon oxide layer 705 electrically isolates a conductive gate 702 formed over the second isolating layer 705. The two silicon oxide layers 703 and 705 function as isolation dielectric layers.

Other than SONOS nonvolatile memory, the memory array can also be constructed with floating gate nonvolatile memory as exemplarily illustrated in FIG. 10. The floating gate nonvolatile memory cell 70 includes a P type substrate 706 with two buried N+ junctions, one being the source 700 and the other being the drain 701. A channel 707 is formed between the source 700 and the drain 701. Above the channel is a first isolating layer 703, which generally is a silicon oxide layer. On top of the first isolating layer 703 is a conductive floating gate layer 704, which generally is a poly-silicon layer. The floating gate layer 704 forms the memory retention layer that stores the electrons as they are injected into the floating gate layer. A second isolating layer 705, which generally is a stacked oxide-nitride-oxide (ONO) layer, is formed to overlay the poly-silicon layer. The ONO layer electrically isolates a conductive gate 702 formed over the second isolating layer 705. The two layers 703 and 705 function as isolation dielectric layers.

Although the invention has been described with reference to the preferred embodiments, it will be understood that the invention is not limited to the details described thereof. Substitutions and modifications have been suggested in the foregoing description, and others will occur to those of ordinary skill in the art. In particular, the process steps of the method according to the invention will include methods having substantially the same process steps as the method of the invention to achieve substantially the same result. Therefore, all such substitutions and modifications are intended to be within the scope of the invention as defined in the appended claims and their equivalents.

We claim:

1. A method for erasing a nonvolatile memory cell comprising a source, a gate, a drain, a channel and a charge storage layer, the method comprising:
    applying an erasing process, the erasing process comprising:
    applying a negative gate voltage pulse to the gate;
    applying a source voltage pulse to the source;
    applying a drain voltage pulse to the drain wherein the drain voltage pulse is generally higher than the source voltage pulse;
    evaluating the level of a threshold voltage of the memory cell to determine whether an erase state is reached; and
    repeating the erasing process by keeping the magnitude of the negative gate voltage pulse constant while increasing the magnitudes of the source and drain voltage pulses with each repeat of the erasing process unit the level of the threshold voltage is reached and the memory cell is in the erase state.

2. The method of claim 1, wherein the erasing process comprises conducting a charge injection process to inject electric holes into the charge storage layer.

3. The method of claim 2, further comprising the step of performing a band-to-band hot hole injection in the nonvolatile memory.

4. The method of claim 1, wherein the nonvolatile memory comprises a SONOS and floating gate nonvolatile memory.

5. The method of claim 1, wherein the nonvolatile memory comprises read only memory (ROM), flash memory, programmable read only memory (PROM), erasable programmable read only memory (EPROM), electrically erasable programmable read only memory (EEPROM), and flash EEPROM.

6. A nonvolatile memory cell in an erase state, the memory cell comprising:
    A substrate;
    A source;
    A drain;
    A channel formed between the source and the drain;
    A first isolating layer over the channel;
    A charge storage layer over the first isolating layer;
    A second isolating layer over the charge storage layer; and
    A gate formed over and isolated by the second isolating layer;
    Wherein the charge storage layer includes electric holes injected therein by applying a series of first, second and third voltage pulses respectively to the source, drain and gate, keeping the magnitude of the gate voltage pulse negative and constant while increasing the magnitudes of the source and drain voltage pulses with each repeat of the erasing process.

7. The memory of claim 6, wherein the substrate is a p-type substrate, the source and the drain are n+ junctions.

8. The memory of claim 7, wherein the charge storage layer is a nitride layer, the first isolating layer is a silicon oxide layer and the second isolating layer is an oxide layer.

9. The memory cell of claim 8, wherein the channel formed between the source and the drain has either a short channel length or a long channel length.

10. The memory cell of claim 9, wherein the short channel length is defined by a channel length to channel width ratio of about 0.25/0.2.

11. The memory cell of claim 10, wherein the long channel length is defined by a channel length to channel width ratio of about 0.27/0.2.

12. A method for erasing a nonvolatile memory cell having a source, a gate, a drain, a channel and a charge storage layer, the method comprising:
 applying a series of first voltage pulses to the source;
 applying a series of second voltage pulses to the drain;
 applying a series of negative third voltage pulse to the gate;
 keeping constant the negative third voltage pulse; and
 increasing the first and second voltage pulses with each repeat of the erasing process, whereby electric holes are injected in the charge storage layer to erase the memory cell.

13. The method of claim 12, further including conducting an erase verification step to determine whether a threshold voltage of the memory cell is reached and the memory cell is in an erase state.

* * * * *

UNITED STATES PATENT AND TRADEMARK OFFICE
CERTIFICATE OF CORRECTION

PATENT NO.       : 7,035,147 B2
APPLICATION NO.  : 10/465396
DATED            : April 25, 2006
INVENTOR(S)      : Yeh et al.

It is certified that error appears in the above-identified patent and that said Letters Patent is hereby corrected as shown below:

Column 10, Line 20, delete the word "unit" and insert in lieu thereof the word -- until --

Signed and Sealed this

Twenty-fourth Day of April, 2007

JON W. DUDAS
*Director of the United States Patent and Trademark Office*